(12) United States Patent  
Friddell (10) Patent No.: US 8,407,492 B2
(45) Date of Patent: Mar. 26, 2013

(54) SYSTEM AND METHOD OF ASYNCHRONOUS LOGIC POWER MANAGEMENT

(75) Inventor: Thomas H. Friddell, Kent, WA (US)

(73) Assignee: The Boeing Company, Chicago, IL (US)

( * ) Notice: Subject to any disclaimer, the term of this patent is extended or adjusted under 35 U.S.C. 154(b) by 405 days.

(21) Appl. No.: 12/687,676

(22) Filed: Jan. 14, 2010

(65) Prior Publication Data

US 2011/0169536 A1 Jul. 14, 2011

(51) Int. Cl.
| | |
|---|---|
| *G06F 1/00* | (2006.01) |
| *G06F 1/26* | (2006.01) |
| *G06F 15/00* | (2006.01) |
| *G06F 9/46* | (2006.01) |
| *H04L 7/00* | (2006.01) |

(52) U.S. Cl. ........ 713/300; 713/320; 713/500; 375/354; 712/231; 712/244; 718/102

(58) Field of Classification Search .................. 713/300, 713/320, 500; 375/354; 712/231, 244; 718/102
See application file for complete search history.

(56) References Cited

U.S. PATENT DOCUMENTS

| | | | |
|---|---|---|---|
| 5,465,354 A * | 11/1995 | Hirosawa et al. ............. | 718/106 |
| 5,572,070 A | 11/1996 | Ross | |
| 5,579,526 A | 11/1996 | Watt | |
| 5,845,109 A | 12/1998 | Suzuki et al. | |
| 6,014,749 A | 1/2000 | Gloor et al. | |
| 6,049,882 A | 4/2000 | Paver | |
| 6,369,614 B1 | 4/2002 | Ridgway | |
| 7,114,086 B2 | 9/2006 | Mizuyabu | |
| 7,346,791 B2 * | 3/2008 | Kato et al. ...................... | 713/322 |
| 8,065,459 B2 * | 11/2011 | Bekooij ......................... | 710/244 |
| 2003/0076154 A1 | 4/2003 | Shakeri et al. | |
| 2008/0091853 A1 | 4/2008 | Dolle | |
| 2010/0299541 A1 * | 11/2010 | Ishikawa et al. .............. | 713/300 |
| 2010/0327961 A1 | 12/2010 | Ikenaga et al. | |

OTHER PUBLICATIONS

Combined Search and Examination Report under Sections 17 and 18(3); Application No. GB1021949.1; Intellectual Property Office (United Kingdom); May 6, 2011; (7 pgs).

* cited by examiner

*Primary Examiner* — Stefan Stoynov
(74) *Attorney, Agent, or Firm* — Toler Law Group, P.C.

(57) ABSTRACT

Methods, apparatuses, and systems are disclosed to facilitate power management of asynchronous logic devices to operate asynchronous logic devices at a desired level of processing throughput with minimal power consumption. A plurality of completion signals is received from a processing circuit. Each of the plurality of completion signals identifies an associated operation has been completed by the processing circuit. A plurality of phase signals is generated where the plurality of phase signals includes a respective phase signal generated at a time when each of the plurality of completion signals is expected to be received. A plurality of time differences is determined where each of the time differences is based on a difference between receipt of a completion signal and the respective phase signal generated at the time when the completion signal is expected to be received. A composite difference of the time differences is totaled. A voltage supplied to the processing circuit is adjusted based on the composite difference.

20 Claims, 6 Drawing Sheets

SYSTEM AND METHOD OF ASYNCHRONOUS LOGIC POWER MANAGEMENT

STATEMENT OF GOVERNMENT RIGHTS

The disclosure was made with Government support under contract number FA8750-04-C-0007 awarded by the United States Air Force. The Government has certain rights in this disclosure.

FIELD OF THE DISCLOSURE

The present disclosure is generally related to managing power supplied to asynchronous logic.

BACKGROUND

Asynchronous processing logic may provide a desirable alternative to using synchronous processing logic in signal processing or other applications. Synchronizing a plurality of synchronous processing logic devices may depend on routing clock signals and on providing a network of clock buffers to propagate synchronized clock signals to each of the synchronous logic processing devices. By contrast, asynchronous processing logic provides results that are stored whenever an operation is complete. A disadvantage of asynchronous processing logic is that the time at which output is available may depend on the complexity of a particular operation, an amount of power provided to the asynchronous processing logic, an operating temperature of the asynchronous processing logic, process variations that may have affected the operation of a particular chip or wafer, and other factors.

When using asynchronous processing logic in portable devices or other situations, minimizing power consumption involves balancing competing interests. The asynchronous processing logic may be expected to operate at a particular speed to achieve a desired throughput. At the same time, it may be desirable to operate the asynchronous processing logic at a lowest workable power level. As previously mentioned, operating temperature, process variations in manufacture, etc., may make it difficult to predict what power level will result in the desired throughput. To ensure the desired throughput, design timing margins being added which may result in higher static power consumption and higher dynamic power consumption. There is therefore a need to adjust the voltage supplied to asynchronous processing logic to maintain a desired processing throughput while minimizing power consumption.

SUMMARY

Embodiments disclosed herein include methods, apparatuses, and systems to manage power supplied to a processing device to minimize power consumption while meeting a specified level of throughput. For example, an asynchronous processing system may perform a plurality of operations on received data. The completion of each of the operations is signaled by a completion signal that causes the result to be stored. The time it takes to complete each of the operations may be a function of a voltage supplied to the asynchronous processing system or to each of the portions of the asynchronous processing system. Phase signals may be generated at offsets to a clock signal such that each respective phase signal signifies a time at which a particular completion signal is expected to be received. When receipt of the particular completion signal lags behind generation of the respective phase signal, voltage supplied to the portion of the asynchronous processing system may be increased to increase processing performance. Conversely, when receipt of the particular completion signal leads ahead of generation of the respective phase signal, voltage supplied to the portion of the asynchronous processing system may be decreased to save power. The differences between the completion signals and the respective phase signals may be filtered, weighted and combined to place emphasis on controlling throughput of intermediate processing operations rather than simply using the final completion signal at which location there may be insufficient control to avoid late computations.

In a particular illustrative embodiment, a plurality of completion signals is received from a processing circuit. Each of the plurality of completion signals identifies whether an associated operation has been completed by the processing circuit. A plurality of phase signals is generated and the plurality of phase signals includes a respective phase signal generated at a time when each of the plurality of completion signals is expected to be received. A plurality of time differences is determined. Each of the time difference is measured between receipt of a completion signal and the respective phase signal generated at the time when the completion signal is expected to be received. A composite difference of each of the plurality of measured time differences is computed. A voltage supplied to the processing circuit is adjusted based on the composite difference.

In another particular illustrative embodiment, an apparatus includes a phase generator that generates a plurality of phase signals. Each of the plurality of phase signals is generated at an offset to a received clock signal. Each respective phase signal of the plurality of phase signals represents a time at which one of a plurality of completion signals is expected to be received from a processing system. One or more time differencing elements are configured to determine a time difference between receipt of each of the plurality of completion signals and the respective phase signal of the plurality of phase signals. A control unit is configured to determine a composite time difference of each of the time differences for each of the plurality of completion signals and the respective phase signal. The control unit generates a voltage signal to control an operational speed of the processing system. When the composite time difference reflects that the plurality of completion signals predominantly lags behind the plurality of respective phase signals, the control unit generates the voltage signal (e.g., increases the voltage) to reduce the operational speed of the processing system. When the composite time difference reflects that the plurality of completion signals predominantly leads the plurality of phase signals, the control unit generates the voltage signal (e.g., to increase the voltage) to increase the operational speed of the processing system.

In still another particular illustrative embodiment, a system includes a self-timed asynchronous processing unit in which each of a plurality of completion signals is generated when an operation of the asynchronous processing unit is completed. A clock generator is configured to generate a clock signal. A phase detector includes a phase generator configured to generate a plurality of phase signals where a respective phase signal is generated at an offset to the clock signal at a time when one of a plurality of completion signals is expected to be received. The phase detector also includes a plurality of time differencing elements configured to determine a plurality of time differences. Each of the plurality of time differences is measured between receipt of a completion signal and the respective phase signal generated at the time when the completion signal is expected to be received. A control unit is configured to determine a composite difference of each of the time differences. A modulation-based voltage switching converter is configured to modulate voltage to be supplied to the asynchronous processing unit in response to the voltage signal generated by the control unit.

The features, functions, and advantages that have been described can be achieved independently in various embodiments or may be combined in yet other embodiments, further details of which are disclosed with reference to the following description and drawings.

BRIEF DESCRIPTION OF THE DRAWINGS

The first digit of each reference numeral refers to the figure number of the first figure in which the referenced element appears.

DETAILED DESCRIPTION

Particular illustrative embodiments of methods, apparatuses, and systems balance power consumption and performance for a processing system by comparing completion signals to phase signals generated at points in time when the completion signals are expected to be received. When receipt of the completion signals lags behind the generation of the phase signals, such as when a combined completion indicator to be determined by, in one exemplary embodiment, collecting, weighting and summing the individual time differences between completion signals and phase signals indicate a lagging state, the voltage supplied may be increased to improve processing performance so that the adjusted completion signals are received at or close to the time the phase signals are generated. Conversely, when receipt of the completion signals (such as indicated by the combined completion indicator) leads ahead of the generation of the phase signals, the voltage supplied to the processing system may be reduced to conserve power. As a result, operation of a processing system, such as a self-timed asynchronous processing system, may be managed to balance performance with power consumption.

Figure 1:
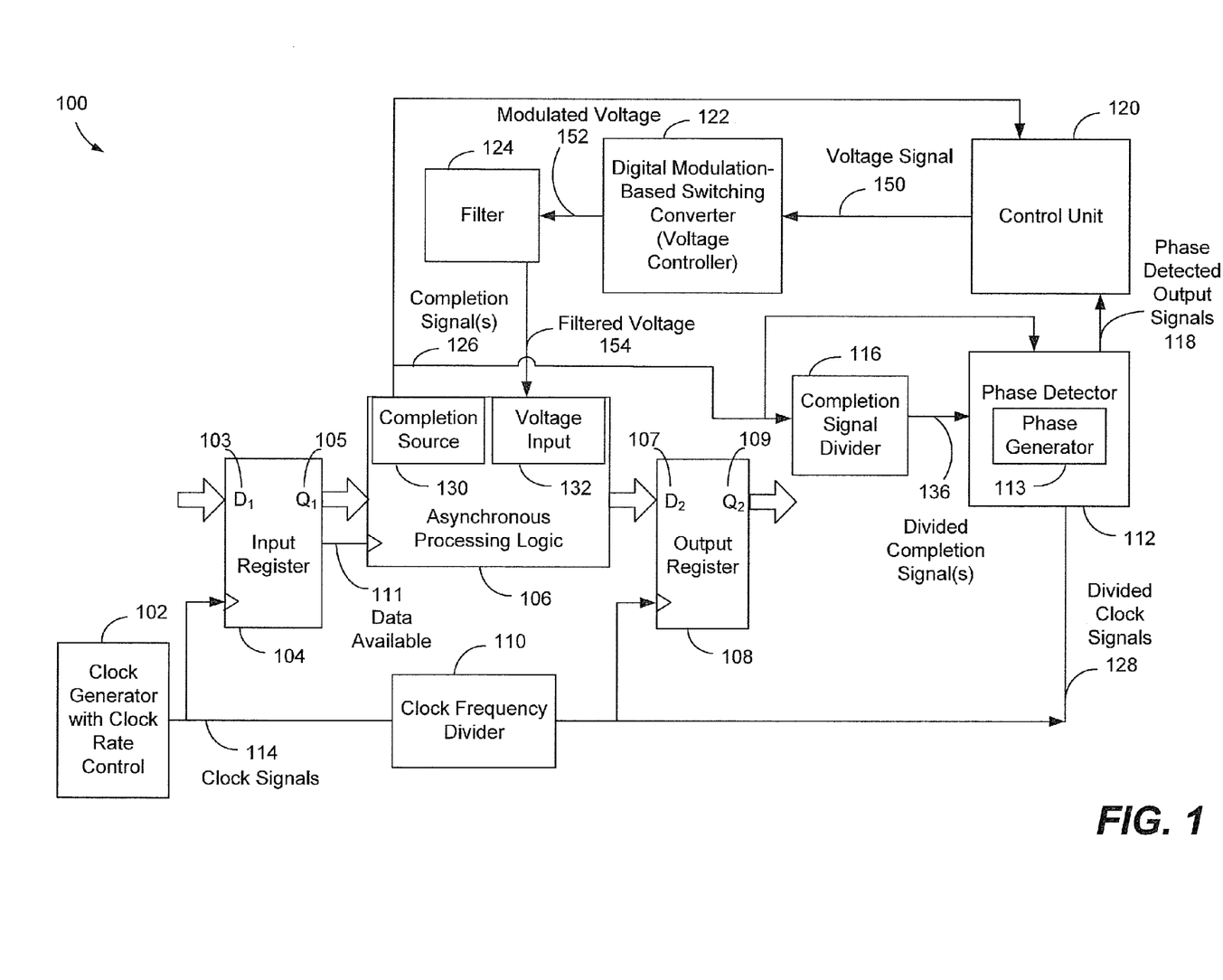
FIG. 1 is a block diagram of a particular embodiment of a system that includes asynchronous processing logic managed by a phase detector and a control unit that controls a supply of modulated voltage to the asynchronous processing logic.

FIG. 1 is a block diagram of a particular embodiment of a system 100 that Includes asynchronous processing logic 106 with input voltage managed by a phasedetector 112 and a control unit 120. The particular illustrative embodiment of FIG. 1 controls a supply of modulated voltage to the asynchronous processing logic 106.

Asynchronous computing architectures provide more alternative arrangements of logic elements to perform a computation. Some architectures have lower variability of completion signal timing than others. Some architectures that limit variability in completion signal timing may do so at the expense of speed, while other architectures may limit the variability of completion signal timing without significantly sacrificing speed. For example, an asynchronous processing device that uses a look-up table tends to have very regular timing of completion signals because its operations are consistent with each different calculation: an address is decoded, the memory contents at that address are sensed, and the contents are then output. On the other hand, for example, a special purpose square root operation might involve recursive computation. The speed of the computation may vary significantly depending on the data input to the computation. In the interest of achieving minimum power consumption, it may be desirable to use architectures with low timing variability.

The particular illustrative embodiment of the system 100 includes a clock generator with clock rate control 102, one or more input registers, such as input register 104, and one or more output registers, such as output register 108. The system 100 may adapt to changing clock rates generated by the clock generator 102 as determined by needs of the system 100 while seeking to maintain minimum power expenditure. The input register 104 and the output register 108 may include latches, flip-flops, or other devices operable to store input and output data bits, respectively.

The system 100 includes an optional clock frequency divider 110 and an optional completion signal divider 116. The system also includes a digital modulation-based switching converter 122 as a voltage controller and a filter 124. The asynchronous processing logic 106 includes a completion source 130 that represents one or more completion signals 126 generated by the asynchronous processing logic 106. In a particular illustrative embodiment, every logic element included in the asynchronous processing logic 106 generates a completion signal. The completion source 130, for purposes of illustration, collectively represents the completion signals generated by each of the devices in the asynchronous processing logic that generated a completion signal. The asynchronous processing logic also includes a voltage input 132. The asynchronous processing logic 106 is coupled to receive input data from one or more input registers, such as input register 104, and to provide output data to one or more output registers, such as the output register 108. The input register 104 and the output register 108, respectively, may be used to receive input from and supply output to one or more synchronous or asynchronous devices that use the asynchronous processing logic 106 to process data. The input register 104 is coupled to receive a clock signal 114 from the clock generator 102. When data stored by the input register 104 is available at a data output $Q_1$ 105 of the input register, a data available output 111 generates a data available signal that is received by the asynchronous processing logic 106.

When the clock frequency divider 110 is used, a completion signal divider 116 is also used. The clock frequency divider 110 receives the clock signal 114 from the clock generator 102 and the clock frequency divider 110 provides a selected sampling or selected subset of a number of pulses of the clock signal 114 as a divided clock signal 128 to the phase detector 112. The completion signal divider 116 receives the completion signals 126 from the completion source 130 and provides a selected sampling or selected subset of a number of the completion signals 126 as divided completion signals 136 to the phase detector 112. The phase detector 112 compares the divided completion signals 136 to the divided clock signal 128 and to phase signals generated at offsets to the divided clock signal 128. When the clock frequency divider 110 and the completion signal divider 116 are not used, the phase detector 112 receives the clock signal 114 from the clock generator 102 and receives the completion signals 126 from the completion source 130 of the asynchronous processing logic 106. In this configuration, the phase detector 112 may, thus, monitor each of the completion signals 126 and compare them to the clock signal 114 and to phase signals generated at offsets to the clock signal 114 instead of comparing samples of each.

The control unit 120 is coupled to receive phase detected output signals 118 from the phase detector 112. The control unit 120 also receives the completion signals 126 from the asynchronous processing logic 106. The control unit 120 provides a voltage signal 150 to the digital modulation-based switching converter 122 which is coupled to the filter 124. The voltage signal 150 controls the voltage supplied to the asynchronous processing logic 106.

During operation, a clock signal 114 is generated by the clock generator 102 and is provided to the input register 104, the output register 108, and the clock frequency divider 110. The clock input register 104 receives data at a data input $D_1$ 103 and presents latched data at the data output $Q_1$ 105. The latched data presented at the data output $Q_1$ 105 may be provided to the asynchronous processing logic 106 using level translators (not shown). The asynchronous processing logic 106 has a completion source 130 that collectively represents a source of completion signals 126 generated by the asynchronous processing logic 106 and provided to the control unit 120, to the completion signal divider 116, and to the phase detector 112. The completion signals 126 signify the completion of one or more operations being performed by the asynchronous processing logic 106. In a particular embodiment, the asynchronous processing logic 106 represents a self-timed asynchronous device that provides the completion signals 126 to report on processing progress.

The completion signals 126, the divided completion signals 136, or a combination of both the completion signals 126 and the divided completion signals 136, may be received by the phase detector 112. The phase detector 112 also receives the clock signal 114, the divided clock signal 128, or a combination of the clock signal 114 and the divided clock signal 128. The phase detector 112, in response to the completion signals 126, the divided completion signals 136, and the clock signal 114 or the divided clock signal 128, performs phase detection and comparison between the completion signals 126 and phase signals based on the clock signal 114, and provides resulting phase detected output signals 118. The phase detected output signals 118 are provided to the control unit 120. Data output of the asynchronous processing logic 106 is presented to a data input $D_2$ 107 of the output register 108 and latched output data is presented at a data output $Q_2$ 109.

The control unit 120, responsive to the phase detected output signals 118 from the phase detector 112, determines a composite difference of time differences measured between receipt of the completion signals 126 or divided completion signals 136 and respective phase signals (not shown in FIG. 1). The respective phase signals are generated by the phase detector 112 at offsets to the clock signal 114 to represent when each of a plurality of completion signals 126 (or divided completion signals 136) is expected to be received.

The voltage signal 150 provided to the digital modulation-based switching converter 122 is determined by whether the plurality of completion signals 126 (or divided completion signals 136) leads ahead of or lags behind the phase signals.

When the plurality of completion signals 126 (or divided completion signals 136) leads ahead of the phase signals, the voltage signal 150 is communicated to decrease the output voltage of the digital modulation-based switching converter 122. Alternatively, when the plurality of completion signals lags behind the phase signals, the voltage signal 150 is communicated to increase the output voltage of the digital modulation-based switching converter 122 In response to the voltage signal 150, the digital modulation-based switching converter 122 varies a modulation parameter in order to decrease, increase, or maintain the voltage presented by a modulated voltage signal 152. The modulation parameter may be frequency, pulse width, or a plurality of other parameters. For example, a particular embodiment, the digital modulation-based switching converter 122 may generate a time-varying voltage signal. The filter 124 smoothes ripples in the voltage signal resulting in either a higher filtered voltage 154 or a lower filtered voltage 154. The level of the filtered voltage 154 may control the processing speed and the power consumption of the asynchronous processing logic 106.

Thus, the system 100 may be implemented by an apparatus including a phase generator 113 to generate one or more phase signals, and a control unit 120 that, for each of the one or more phase signals, identifies a time difference between receipt of each of the one or more completion signals 126 and one or more respective phase signals. When a plurality of completion signals are generated, the control units can determine a composite time difference of each of the time differences for each of the plurality completion signals 126 (or divided completion signals 136) and the respective phase signal during a processing cycle of the asynchronous processing logic 106. Based on the composite time difference, the control unit 120 generates the voltage signal 150 to control an operational speed of the asynchronous processing logic 106.

In a particular embodiment, the phase detector 112 includes a phase generator 113 that includes one or more phase locked loops (PLLs). Each of the phase locked loops is designed to generate a phase signal at an offset to each of a plurality of clock pulses included in the clock signal 114 (or the divided clock signal 128). In addition, the control unit 120 may include logic to apply a numerical weight to the time difference between receipt of one of the plurality of completion signals and a respective phase signal, as further described with reference to FIGS. 3 and 5.

Figure 2:
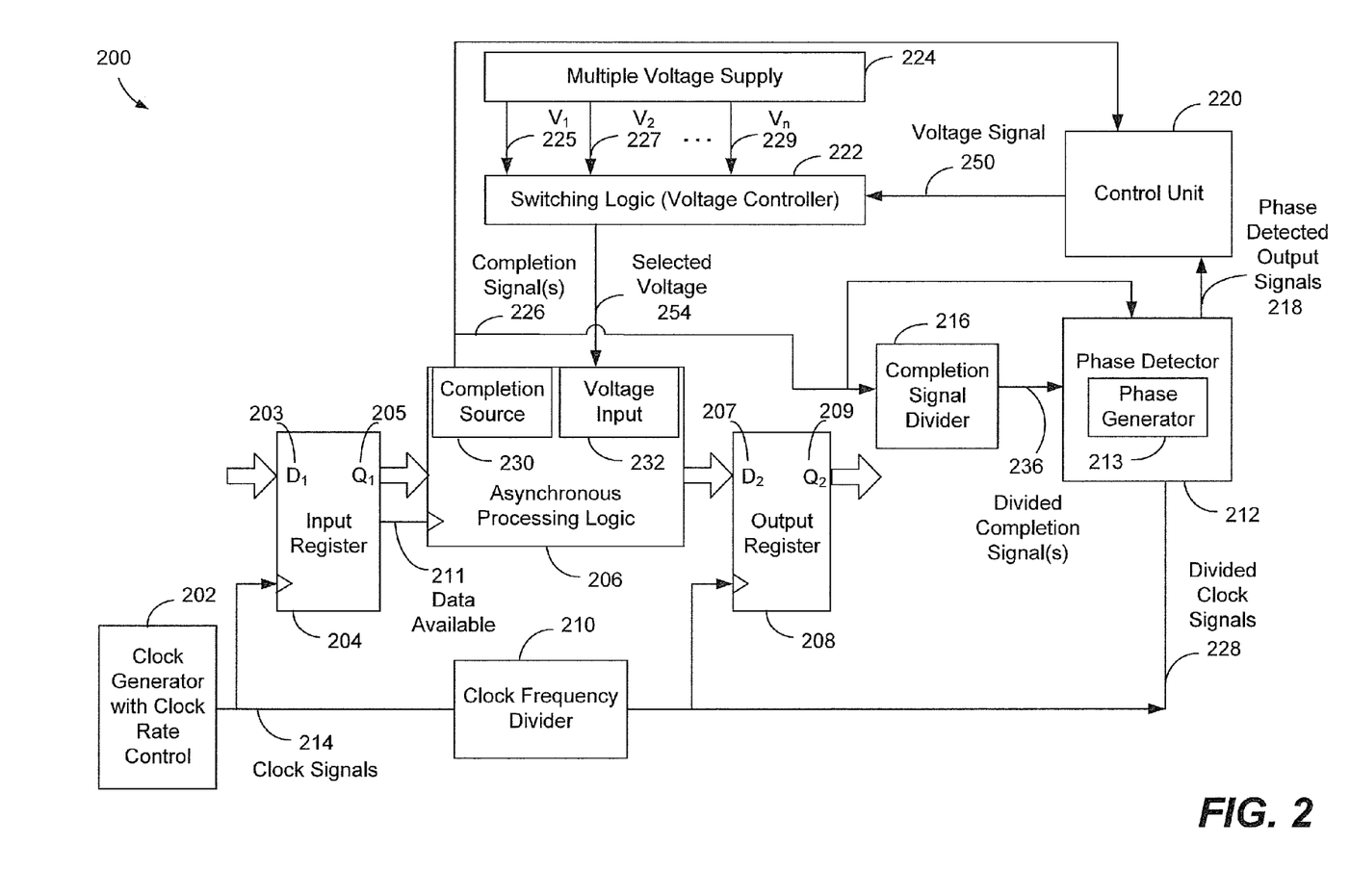
FIG. 2 is a block diagram of an alternative embodiment of a system that includes asynchronous processing logic managed by a phase detector and a control unit that selectively supplies one of a plurality of provided voltages to the asynchronous processing logic.

FIG. 2 is a block diagram of an alternative embodiment of a system 200 that includes asynchronous processing logic 206 managed by a phase detector 212 and a control unit 220 that selectively supplies one of a plurality of provided voltages to the asynchronous processing logic. The system 200 is similar to the system 100 of FIG. 1 except in the way that voltage is provided to asynchronous processing logic 206.

Instead of using the digital modulation-based switching converter 122 as a voltage controller to supply the modulated voltage 152 to the filter 124 as the system 100 of FIG. 1, the system 200 of FIG. 2 uses switching logic 222 and a multiple voltage supply 224. In response to a voltage signal 250 received from a control unit 220, the switching logic 222 selects one of a plurality of supplied voltages $V_1$ 225, $V_2$ 227, through $V_n$ 229 provided by the multiple voltage supply 224 and provides a selected voltage 254 to a voltage input 232 of the asynchronous processing logic 206. Because a plurality of supplied voltages are available, there is no need to generate the modulated voltage signal 152 and pass the modulated voltage 152 through the filter 124 to provide ripple-limited voltage to the asynchronous processing logic 206.

Otherwise, the system 200 includes the same component and operates in the same as the system 100 of FIG. 1. The system 200 includes a clock rate control unit 202, one or more input register, such as input register 204, and one or more output registers, such as output register 208. The input register 204 and the output register 208 may include latches, flip-flops, or other devices operable to store input and output data bits, respectively. The system 200 includes an optional clock frequency divider 210 and an optional completion signal divider 216. The asynchronous processing logic 206 includes a completion source 230 that represents one or more completion signals 226 generated by the asynchronous processing logic 206. The asynchronous processing logic 206 is coupled to receive input data from one or more input registers, such as input register 204, and to provide output data to one or more output registers, such as output register 208. The input register 204 and the output register 208, respectively, may be used to receive input from and supply output to one or more synchronous or asynchronous devices that use the asynchronous processing logic 206 to process data. The input register 204 is coupled to receive a clock signal 214 from the clock rate control unit 202. When data stored by the input register 204 is available at a data output $Q_1$ 205 of the input register, a data available output 211 generates a data available signal that is received by the asynchronous processing logic 206.

When the clock frequency divider 210 is used, a completion signal divider 216 is also used. The clock frequency divider 210 receives the clock signal 214 from the clock rate control unit 202 and the clock frequency divider 210 provides a selected sampling or selected subset of a number of pulses of the clock signal 214 as a divided clock signal 228 to the phase detector 212. The completion signal divider 216 receives the completion signals 226 from the completion source 230 and provides a selected sampling or selected subset of a number of the completion signals 226 as divided completion signals 236 to the phase detector 212. The phase detector 212 compares the divided completion signals 236 to the divided clock signal 228 and to phase signals generated at offsets to the divided clock signal 228. When the clock frequency divider 210 and the completion signal divider 216 are not used, the phase detector 212 receives the clock signal 214 from the clock rate control unit 202 and receives the completion signals 226 from the completion source 230 of the asynchronous processing logic 206. In this configuration, the phase detector 212 may, thus, monitor each of the completion signals 226 and compare them to the clock signal 214 and to phase signals generated at offsets to the clock signal 214 instead of comparing samples of each.

The control unit 220 is coupled to receive phase detected output signals 218 from the phase detector 212. The control unit 220 also receives the completion signals 226 from the asynchronous processing logic 206. The control unit 220 provides the voltage signal 250 to the switching logic 222 which selects one of the plurality of supplied voltages $V_1$ 225, $V_2$ 227, through $V_n$ 229 provided by the multiple voltage supply 224 and provides the selected voltage 254 to the voltage input of the asynchronous processing logic 206.

During operation, a clock signal 214 is generated by the clock rate control unit 202 and is provided to the input register 204, the output register 208, and the clock frequency divider 210. The clock input register 204 receives data at a data input $D_1$ 203 and presents latched data at a data output $Q_1$ 205. The latched data presented at the data output $Q_1$ 205 may be provided to the asynchronous processing logic 206 using level translators (not shown). The asynchronous processing logic 206 has a completion source 230 that collectively represents a source of completion signals 226 generated by the asynchronous processing logic 206 and provided to the control unit 220, to the completion signal divider 216, and to the phase detector 212. The completion signals 226 signify the completion of one or more operations being performed by the asynchronous processing logic 206. In a particular embodiment, the asynchronous processing logic 206 represents a self-timed asynchronous device that provides the completion signals 226 to report on processing progress.

The completion signals 226, the divided completion signals 236, or a combination of both the completion signals 226 and the divided completion signals 236, may be received by the phase detector 212. The phase detector 212 also receives the clock signal 214, the divided clock signal 228, or a combination of the clock signal 214 and the divided clock signal 228. The phase detector 212, in response to the completion signals 226, the divided completion signals 236, and the clock signal 214 or the divided clock signal 228, performs phase detection and comparison between the completion signals 226 and phase signals based on the clock signal 214, and provides resulting phase detected output signals 218. The phase detected output signals 218 are provided to the control unit 220. Data output of the asynchronous processing logic 206 is presented to a data input $D_2$ 207 of the output register 208 and latched output data is presented at a data output $Q_2$ 209.

The control unit 220, responsive to the phase detected output signals 218 from the phase detector 212, determines a composite difference of time differences measured between receipt of the completion signals 226 or divided completion signals 236 and respective phase signals (not shown in FIG. 2). The respective phase signals are generated by the phase detector 212 at offsets to the clock signal 214 to represent when each of a plurality of completion signals 226 (or divided completion signals 236) is expected to be received.

The voltage signal 250 provided to the switching logic 222 is determined by whether the plurality of completion signals 226 (or divided completion signals 236) leads ahead of or lags behind the phase signals. When the plurality of completion signals 226 (or divided completion signals 236) leads ahead of the phase signals, the voltage signal 250 is communicated to decrease the output voltage of the switching logic 222. Alternatively, when the plurality of completion signals lags behind the phase signals, the voltage signal 250 is communicated to increase the output voltage of the switching logic 222 The switching logic 222 selects a lower, higher, or same provided voltage from among the plurality of supplied voltages $V_1$ 225, $V_2$ 227, through $V_n$ 229. The selected voltage 254 may control the processing speed and the power consumption of the asynchronous processing logic 206.

Thus, the system 200 may be implemented by an apparatus including a phase generator 213 to generate one or more phase signals, and a control unit 220 that, for each of the one or more phase signals, identifies a time difference between receipt of each of the one or more completion signals 226 and one or more respective phase signals. When a plurality of completion signals are generated, the control units can determine a composite time difference of each of the time differences for each of the plurality completion signals 226 (or divided completion signals 236) and the respective phase signal during a processing cycle of the asynchronous processing logic 206. Based on the composite time difference, the control unit 220 generates the voltage signal 250 to control an operational speed of the asynchronous processing logic 206.

In a particular embodiment, the phase detector 212 includes a phase generator 213 that includes one or more phase locked loops (PLLs). Each of the phase locked loops is designed to generate a phase signal at an offset to each of a plurality of clock pulses included in the clock signal 214 (or the divided clock signal 228). In addition, the control unit 220 may include logic to apply a numerical weight to the time difference between receipt of one of the plurality of completion signals and a respective phase signal, as further described with reference to FIGS. 3 and 5.

Figure 3:
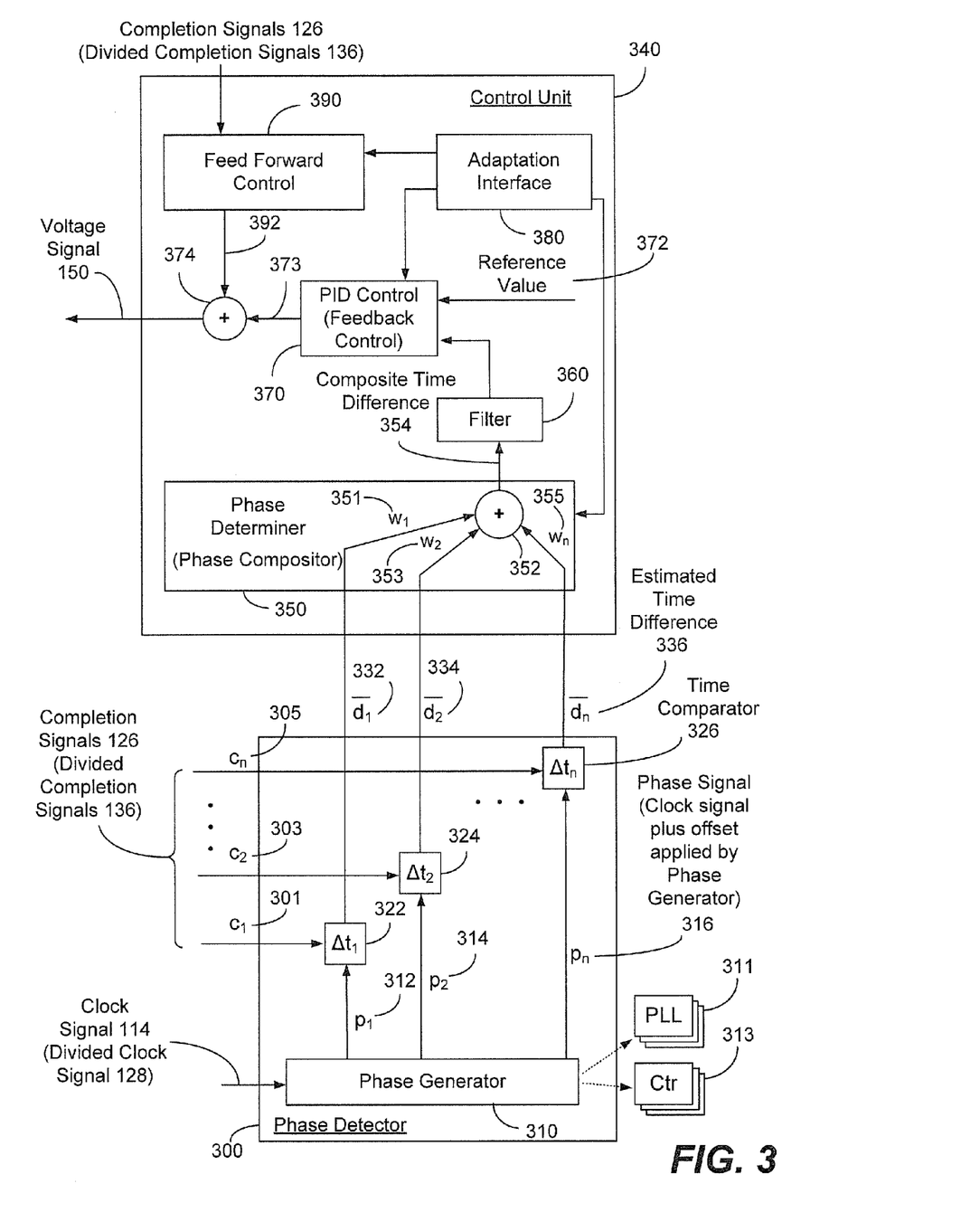
FIG. 3 is a block diagram of a particular embodiment of the phase detector and the control unit as may be used in the system of FIG. 1.

FIG. 3 is a block diagram of a particular embodiment of a phase detector 300 and a control unit 340 as may be used by the phase detector 112 and the control unit 120 in the system 100 of FIG. 1 or the system 200 of FIG. 2. FIG. 3 includes further details of the phase detector 112, 212 and control unit 120, 220 of the systems 100 of FIG. 1 and the system 200 of FIG. 2, respectively. In particular, the phase detector 300 includes a phase generator 310 and a plurality of time differencing elements $\Delta t_1$ 322, $\Delta t_2$ 324, and $\Delta t_n$ 326. The time differencing elements measure the difference in time between the completion signal and the phase signal. The time differencing elements may include comparators or may provide a varying digital or analog output. For example, in a low power analog implementation, the time differencing elements may include charge integrators fed by a constant current source having an output voltage that is proportional to the time difference. The time differencing elements may be offset in voltage so as to be capable of representing both positive and negative slack (i.e., the amount of time that the completion signal precedes the phase signal and can be positive or negative). In a digital example, the time differencing elements may include time-to-digital converters such that the output would be a signed digital representation of the slack.

The phase generator 310 is coupled to receive the clock signal 114, 214 (or a divided clock signal 128, 228 that samples the clock signal 114, 214 as described with reference to FIGS. 1 and 2). The phase generator 310, using one or more phase locked loops (PLLs) 311, a plurality of counters 313, or another device, applies an offset to each of the clock signals 114, 214 (or divided clock signals 128, 228) to generate a plurality of phase signals $p_1$ 312, $p_2$ 314, and $p_n$ 316. The offset applied represents an allotted period for receipt of one of the plurality of completion signal 126, 226 (or divided completion signals 136, 236) following the application of each of the clock signals 114, 214 (or divided clock signals 128, 228). In other words, the offsets generated by the phase generator 310 represent an expected time period allotted for completion of an operation within the asynchronous processing logic 106, the completion of which is signified by receipt of a corresponding one of the plurality of completion signals 126, 226. Any or all of the elements in the control unit 340 or the phase detector 112, 212 including the phase generator 113, 213, the phase compositor 350, etc., could be automatically adapted to minimize slack but not result in negative slack at the $\bar{d}_1$ 332, $\bar{d}_2$ 334, and $\bar{d}_n$ 336 to minimize power consumption.

Each of the time differencing elements $\Delta t_1$ 322, $\Delta t_2$ 324, and $\Delta t_n$ 326 is coupled to receive one of the completion signals 126 (or divided completion signals 136, 236) $c_1$ 301, $c_2$ 303, and $c_n$ 305 and one of the phase signals $p_1$ 312, $p_2$ 314, and $p_n$ 316 output by the phase generator 310. Through the time differencing elements $\Delta t_1$ 322, $\Delta t_2$ 324, and $\Delta t_n$ 326, the phase detector 300 provides a plurality of time differences $\bar{d}_1$ 332, $\bar{d}_2$ 334, and $\bar{d}_n$ 336, to the control unit 340 where each of the time differences $\bar{d}_1$ 332, $\bar{d}_2$ 334, and $\bar{d}_n$ 336 represents a difference by which each of the completion signals 126 (or divided completion signals 136) $c_1$ 301, $c_2$ 303, and $c_n$ 305 leads ahead of or lags behind the respective phase signal $p_1$ 312, $p_2$ 314, or $p_n$ 316 that represents when each of the completion signals 126, 326 (or divided completion signals 136, 236) was expected to be received.

The control unit 340 includes a phase compositor 350, an optional filter 360, a control feedback element 370, an optional adaptation interface 380, and an optional feed forward control circuit 390. The control unit 340 further includes a summer 374 that combines the signal from the control feedback element 373 and the optional feed forward control 392 and provides the voltage signal 150 (FIG. 1) or 250 (FIG. 2) that may be used to direct the digital modulation-based switching converter 122 of the system 100 or the switching logic 222 of the system 200 as to how much to increase, how much to decrease, or to maintain the voltage supplied to the asynchronous processing logic 106.

During operation, the phase compositor 350 receives the plurality of time Differences $\bar{d}_1$ 332, $\bar{d}_2$ 334, and $\bar{d}_n$ 336 and applies a respective weighting value, such as $w_1$ 351, $w_2$ 353, and $w_n$ 355, to each of the time differences $\bar{d}_1$ 332, $\bar{d}_2$ 334, and $\bar{d}_n$ 336. The weighting values $w_1$ 351, $w_2$ 353, and $w_n$ 355 represent a relative significance of each of the respective time differences $\bar{d}_1$ 332, $\bar{d}_2$ 334, and $\bar{d}_n$ 336 in changing the voltage to be supplied to the asynchronous processing logic 106. For example, the significance and, thus, the weighting value applied to a time difference based on the completion signal of an intermediate result calculated by the asynchronous processing logic 106, 206 may be greater than weighting values applied to completion signals for early or late processes: computation completions near the beginning of the calculation have more time to be corrected and completion of computations toward the end of the calculation are important but have less available control authority, while intermediate calculations have the best control authority.

For example, the completion signals $c_1$ 301 and $c_2$ 303 may represent completion signals for early or intermediate processes, respectively, while the completion signal $c_n$ 305 represents a completion signal of a final result. The weighting values $w_1$ 351 and $w_n$ 355 applied to the time differences $\bar{d}_1$ 332, $\bar{d}_2$ 334, and $\bar{d}_n$ 336 between receipt of the completion signals $c_1$ 301 and $c_n$ 305 and the respective phase signals $p_1$ 312 and $p_n$ 316 may not be as high as the weighting value $w_2$ 353 applied to the time difference $\bar{d}_2$ 334 between receipt of the completion signal $c_2$ 303 and the phase signal $p_2$ 314. Early completion signals such as $c_1$ 301 may consistently lead ahead of the phase signals such as $p_1$ 312 which may indicate that excess power is being supplied to the asynchronous processing logic 106, 206. However, if intermediate completion signals, such as $c_2$ 303 lags behind the phase signal $p_2$ 314, it may be appropriate for a higher voltage to be provided to the asynchronous processing logic 106, 206 so that the final result is presented on time. The respective weighting values $w_1$ 351, $w_2$ 353, and $w_n$ 355 thus may be set so that, even though early or late completion signals $c_1$ 301 and $c_n$ 305 may be received early, if the completion signal $c_2$ 303 of the intermediate result lags behind the respective phase signal $p_2$ 314, the voltage signal 150 generated by the control unit 340 will result in a higher voltage being supplied to the asynchronous processing logic 106, 206.

Note that the foregoing, linear implementation is only one possible technique that may be used to respond to lagging or leading between the completion signals and the phase signals. Other techniques may be used depending on the nature of the asynchronous logic architecture used in the asynchronous processing logic 106. For example, voltage adjustments could be made as a result of maximum phase difference. Alternatively, the weighted average may be replaced by a selective weighted average that ignores time differences showing a very large lead before applying a weighted average. The determination to adjust the voltage supplied to the asynchronous processing logic may be made using any number of suitable calculations.

The adaptation interface 380 may be used to adjust operation of the control unit 340 to control power consumption and processing performance of the asynchronous processing logic. For example, the adaptation interface 380 may enable a user to adjust the weighting values, such as $w_1$ 351, $w_2$ 353, and $w_n$ 355, that are applied to time differences $\bar{d}_1$ 332, $\bar{d}_2$ 334, and $\bar{d}_n$ 336 produced by the time differencing elements $\Delta t_1$ 322, $\Delta t_2$ 324, and $\Delta t_n$ 326. By adjusting the weighting values $w_1$ 351, $w_2$ 353, and $w_n$ 355, based on the history of time differences $\bar{d}_1$ 332, $\bar{d}_2$ 334, and $\bar{d}_n$ 336 the user may be able to reduce power consumption, increase processing performance, or adjust for the relative performance of different operational systems or modes of operation of these systems to tune the power/performance management provided by particular illustrative embodiments. The computations involved in different operating modes may differ in either latency or variability and this allows the adjustment to be made for maximum performance at the minimum power.

The composite time difference 354 of the summer 352 is provided to the filter 360. The filter 360 may be used to smooth fluctuations in the composite time difference 354 generated by the summer 352 to dampen the response of the feedback control 370 to fluctuations of the composite time difference 354. The output of the filter 360 is compared to a reference value 372 by the feedback control 370, which may also be coupled to the adaptation interface 380. The reference value 372, for example, may be used to control the value of the voltage signal 150, 250 to regulate time difference, $\bar{d}_n$ 326. The adaptation interface 380 may enable adjustment of the one or more reference values 372 to adjust the allowed slack time of $\bar{d}_n$ 326.

According to a particular embodiment, a feedback control output 373 may be presented to a second summer 374 that is configured to combine the feedback control output 373 with a feed forward control output 392. The feed forward control unit 390 may receive the completion signals 126 (or divided completion signals 136) of FIG. 1 received by the phase detector 300 and used by the control unit 340 in determining an appropriate value of the voltage signal 150 (FIG. 1) or 250 (FIG. 2).

Operation of the asynchronous logic 106 (FIG. 1) or 206 (FIG. 2) may be non-pipelined (i.e., in which processes are performed sequentially, one at a time, by the Asynchronous processing logic 106, 206 and, thus, completion signals are received and resulting computations are performed in sequence). Alternatively, the operation may be pipelined (i.e., in which multiple computations are performed at the same time by the asynchronous processing logic 106, 206 and, thus, completion signals from successive stages may be received nearly simultaneously such that time differences between the completion signals and phase signals are computed at a same time). For example, an operation performed by the asynchronous processing logic 106, 206 may include multiple successive, sequential processes in which the step of each process is performed on a result of a preceding process. The completion signal for each process is generated as each process is completed, thus, the completion signals will be received sequentially, one after another but since multiple computations are in the pipeline simultaneously, successive completion signals may overlap. Alternatively, the operation performed by the asynchronous processing logic 106, 206 may include multiple, parallel processes that generate completion signals that may arrive simultaneously or at different times and in different sequences depending on the nature of the operations.

For purposes of explanation, operation of the phase detector 300 of FIG. 3 and the control unit 340 are described in a case where the asynchronous processing logic 106 of FIG. 1 performs a pipelined operation and in which a digital modulation-based switching converter 122 and a filter 124 are used to provide the filtered voltage 154 to the voltage input 132 of the asynchronous processing logic 106 as an operating voltage. The completion signals $c_1$ 301, $c_2$ 303, and $c_n$ 305 are compared to respective phase signals $p_1$ 312, $p_2$ 314, and $p_n$ 316 (FIG. 3). The completion signals $c_1$ 512, $c_2$ 522, and $c_3$ 532 (FIG. 5) may represent completion of a pipeline calculation or may be taken from anywhere along the computational path.

Control stability depends on the relative difference between the response time of the filter 154 of FIG. 1 and the processing speed (i.e. completion signal update period) available when the asynchronous processing logic 106 is operating at filtered voltage 154. As long as control stability is maintained the completion signals $c_1$ 512, $c_2$ 522, and $c_3$ 532 (FIG. 5) may not require processing at the full rate and may be divided down in frequency into the divided completion signals 136 using the completion signal divider 116.

The time comparator elements $\Delta t_1$ 322, $\Delta t_2$ 324, and $\Delta t_n$ 326 (FIG. 3) may have filtering elements incorporated to produce filtered time differences $\bar{d}_1$ 332, $\bar{d}_2$ 334, and $\bar{d}_n$ 336. Each of the time comparator elements $\Delta t_1$ 322, $\Delta t_2$ 324, $\Delta t_n$ 326 may include one or more filtering elements so that, as each time difference is computed, each filter generates a filtered time difference based on the current difference and past differences for that completion signal and phase input using either linear or non-linear filtering operations. The filtering operations may include, for example, finite- or infinite-impulse response linear filters, nonlinear filters such as median filtering and outlier filtering, maximum value, or predictive methods. In a simple case where all filters contained within the time comparators are linear filters and they all perform identical functions, these filters may be combined and reside in filter 360 as shown in FIG. 3.

Figure 5:
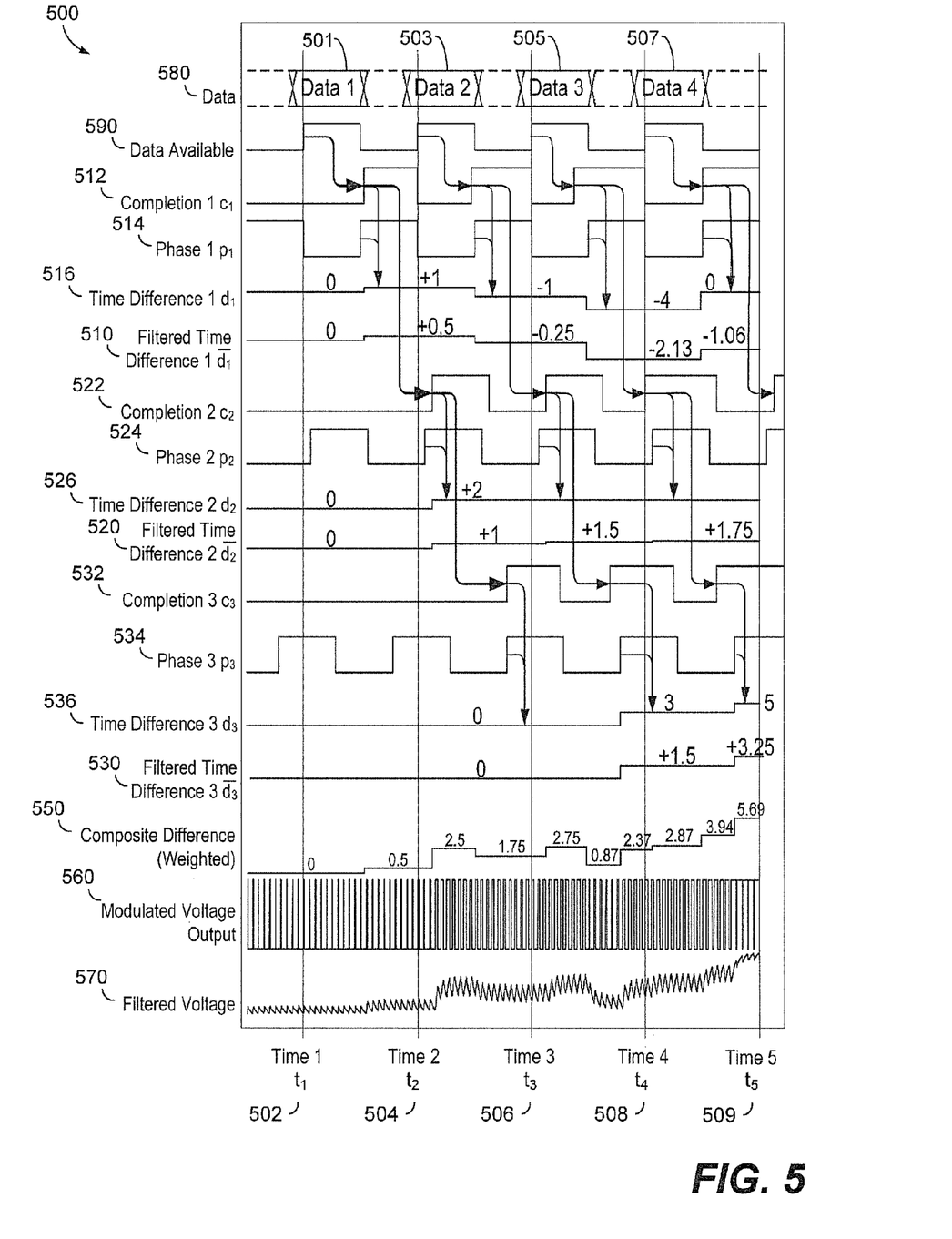
FIG. 5 is a timing diagram illustrating changes in a supplied level of voltage based on changes in the time differences between completion signals and respective phase signals.

In one particular embodiment, each time one of the completion signals $c_1$ 301, $c_2$ 303, and $c_3$ 305 is received, respective time comparator elements $\Delta t_1$ 322, $\Delta t_2$ 324, and $\Delta t_n$ 326 accumulate an estimate of the performance of a stage associated with each respective time differencing element $\Delta t_1$ 322, $\Delta t_2$ 324, or $\Delta t_n$ 326 as compared to the respective phase signals $p_1$ 312, $p_2$ 314, and $p_n$ 316 generated for each of the completion signals $c_1$ 301, $c_2$ 303, and $c_n$ 305 to generate filtered time differences $\bar{d}_1$ 332, $\bar{d}_2$ 334, and $\bar{d}_n$ 336. The filtered time differences $\bar{d}_1$ 332, $\bar{d}_2$ 334, and $\bar{d}_n$ 336 generated by each of the time comparator elements $\Delta t_1$ 322, $\Delta t_2$ 324, $\Delta t_n$ 326, respectively, are then combined in the phase compositor 350 in the control unit 340 to produce a composite time difference signal 354. A digital or analog composite time difference signal 354 generated by the phase compositor 350 is then presented to a proportional-integral-derivative (PID) controller 370. For the sake of illustration, FIG. 5 (described later) shows what would happen if the PID controller 370 was configured to pass the composite time difference signal, disabling the regulation function that would normally be driving the asynchronous processing logic 106 (FIG. 1) to its optimum low power operating point. Thus, the power signal 150 (FIG. 1) in FIG. 5 is the same as the composite time difference signal 550.

The voltage signal 150 of FIG. 1 is presented to the digital modulation-based switching converter 122 and is modulated by any of a number of modulation schemes, such as by pulse duty cycle modulation, pulse width modulation, pulse frequency modulation, pulse position modulation, or switched between intermediate voltages that have been efficiently generated elsewhere as in pulse amplitude modulation. The resulting output is the modulated voltage 152. The modulated voltage 152 is filtered by the filter 124 to provide the filtered voltage 154. Note that, using the system of FIG. 2, the voltage supplied to the asynchronous processing logic 206 is not modulated, thus the voltage need not be filtered.

On initial start-up, the control unit 340 may go through a start-up phase that guarantees that computations are performed ahead of when they are required. From that point forward, the system converges to a correct filtered voltage 154 that minimizes power consumption while supporting timely generation of computations.

Figure 4:
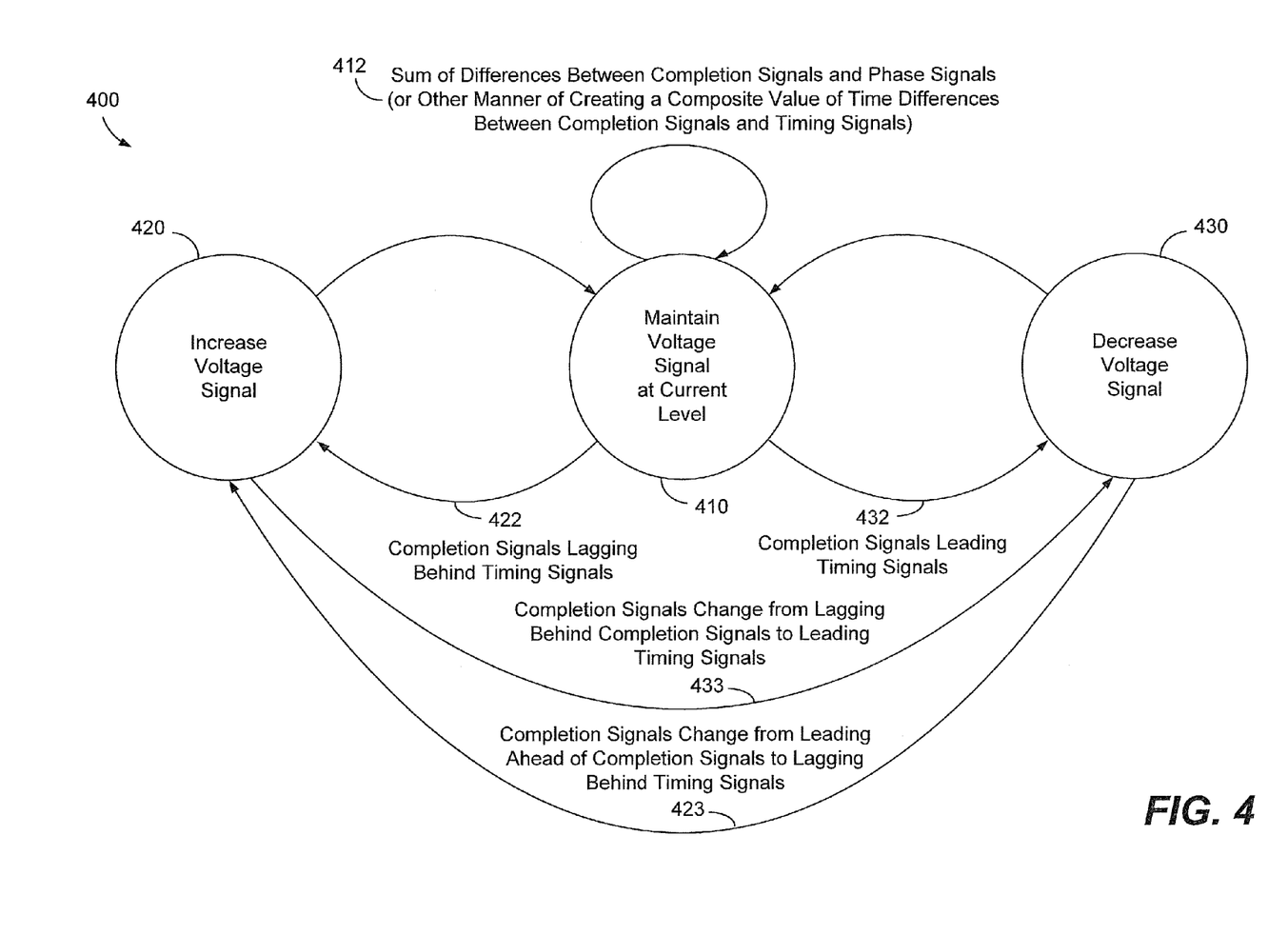
FIG. 4 is a state diagram depicting operation of a particular embodiment of a system for managing power to processing logic based on differences between completion signals and respective phase signals.

FIG. 4 shows a state diagram 400 to illustrate transitions of the control unit 120 of FIG. 1 based on time differences between receipt of the completion signals and the phase signals. The control unit 120 generates the voltage signal 150 that causes the digital modulation-based switching converter 122 to increase, decrease, or maintain the modulated voltage 152 that, via the filter 124, powers the asynchronous processing logic 106 as the filtered voltage 154. The control unit 120 may be in one of three general states: a first state to maintain a voltage signal 150 at the current level 410, a second state to increase the voltage signal 420, or a third state to decrease a voltage signal 430. The control unit 120 may transition between each of the three states 410, 420, 430 in response to various signals. Note that, according to illustrative embodiments, the second state 420 and the third state 430 each may encompass a plurality of states. For example, depending on a degree to which completion signals lead ahead of or lag behind the timing signals, the voltage may be decreased or increased, respectively, by different levels until the completion signals correspond with the timing signals.

By way of example, the control unit 120 (FIG. 1) may transition to the second state 420 (FIG. 4) to increase the voltage signal when a weighted sum of time differences indicate completion signals lagging behind phase signals. When the completion signals previously corresponded with the phase signals, the control unit 120 may have operated in the first state 410 to maintain the voltage signal at a current level. Upon determining that a weighted sum of time differences indicate completion signals lag behind the phase signals, the control unit 120 may transition to the second state 420 along a path 422. Alternatively, when the completion signals previously lead ahead of the phase signals, the control unit 120 may have operated in the third state 430 to decrease the voltage signal. Upon determining that a weighted sum of time differences indicate completion signals lag behind the phase signals, the control unit 120 may transition to the second state 420 along a path 423. On the other hand, if the control unit 120 was operating in the first state 410 to maintain the voltage signal at a current level but determined that a weighted sum of time differences indicate completion signals lead ahead of the phase signals, the control unit 120 may transition to the third state 430 along a path 432. Alternatively, when the completion signals previously lagged behind the phase signals, the control unit 120 may transition from the second state 420 to the third state along a path 433. Thus, based on a weighted sum of the time differences between the completion signals and the phase signals or another measurement or calculation, the voltage signal 150 may change from a first state 410 of maintaining the voltage signal 150 to increasing the voltage signal 150 or decreasing the voltage signal 150, or the voltage signal may be kept constant.

FIG. 5 is a timing diagram 500 illustrating changes in a supplied level of voltage based on changes in the time differences between completion signals and respective phase signal. The signals represent an example of the signals monitored and to which the system is responsive in the system 100 of FIG. 1 using the phase detector 300 and the control unit 340 described with reference to FIG. 3.

FIG. 5 illustrates operation of asynchronous processing logic 106 (FIG. 1) or 206 (FIG. 2) performing a pipelined operation. FIG. 5 also illustrates operation of a system 100 using a digital modulation-based switching converter 122 and a filter 124 to provide a filtered voltage to the asynchronous processing logic 106. By convention, when a completion signal lags behind its respective phase signal, the time difference will be denoted as a positive time difference whereas when a completion signal leads ahead of its respective phase signal, the time difference will be denoted as a negative time difference. The example of FIG. 5 considers a system in which three completion signals $c_1$ 512, $c_2$ 522, and $c_3$ 532 that are compared to respective phase signals $p_1$ 514, $p_2$ 524, and $p_3$ 534. The completion signals $c_1$ 512, $c_2$ 522, and $c_3$ 532 may represent completion of a pipeline calculation or may be taken from anywhere along the computational path. Note that the completion signals $c_1$ 512, $c_2$ 522, and $c_3$ 532 are not only used to modulate voltage to the asynchronous processing logic 106 or 206 of FIGS. 1 and 2, but are also used to signal completion of a respective processing stage to successive processing stages to commence next successive operations.

The completion signals $c_1$ 512, $c_2$ 522, and $c_3$ 532 of FIG. 5 may be divided down using the completion signal divider 116 into the divided completion signals 136 (FIG. 1). For purposes of the example of FIG. 5, however, it is assumed that the completion signals $c_1$ 512, $c_2$ 522 and $c_3$ 532 are not divided.

In a pipelined operation, a sequence in which the completion signals, signals $c_1$ 512, $c_2$ 522, and $c_3$ 532 of FIG. 5 appear at the inputs to the phase detector 112 (FIG. 1) is not necessarily in order of earliest to latest in the pipeline chain. As different data signals 580 are received, including the first data signal 501, the second data signal 503, the third data signal 505 signal, and the fourth data signal 507, the completion signals may not be received in a corresponding sequence. FIG. 5 depicts a sequence in which the completion signals are received in this order: completion signal $c_1$ 512 for the first data signal 501 completing the first stage of computation; completion signal $c_2$ 522 for the first data signal 501 completing the second stage of computation; completion signal $c_1$ 512 for the second data signal 503 completing the first stage of computation; completion signal $c_3$ 532 for the first data signal 501 completing the third stage of computation; completion signal $c_2$ 522 for the second data signal 503 completing the second stage of computation completion signal $c_1$ 512 for the third data signal 505 completing the first stage of computation; completion signal $c_3$ 532 for the second data signal 503 completing the third stage of computation; completion signal $c_2$ 522 for the third data signal 505 completing the second stage of computation; completion signal $c_1$ 512 for the fourth data signal 507 completing the first stage of computation; completion signal $c_3$ 532 for the third data signal 505 completing the third stage of computation; completion signal $c_2$ 522 for the fourth data signal 507 completing the second stage of computation, etc. The sequence will depend on the relative computational durations of each of the pipeline stages, the modulated voltage 154, data-dependent computation time variations, local temperature variations, and integrated circuit fabrication process variability.

The timing diagram of FIG. 5 is used to summarize the operation of the phase detector 112 and the control unit 120 of FIGS. 1 and 3 in adjusting the operation of the asynchronous processing logic 106. As described with reference to FIG. 3, a series of data values 580 is presented to the asynchronous processing logic 106 and the data available output 111 is used to generate a data available signal 590 to indicate when the data is available. After the first pipeline stage completes processing data presented by the first data signal 501, the completion signal, $c_1$ 512 is passed on to the phase detector 112. The completion signal also may be passed to a next stage (not shown) within the asynchronous processing logic 106 to signal that the next stage may begin processing the results of the first stage computations for the first data signal 501. The second data signal 503 is then presented to the asynchronous processing logic 106 and the data available output 111 communicates to the asynchronous processing logic 106 that the second data signal 503 is available. Thus, while the next stage of the asynchronous processing logic 106 is processing the results computed by the first stage for the first data signal 501, the first stage processes the data value presented by the second data signal 503. The data signals 580 advance through each successive, pipelined stage of the asynchronous processing logic 106 in this manner, with a completion signal being generated as each successive stage completes processing the value of each received data signal 580.

In one particular embodiment, each time one of the completion signals $c_1$ 512, $c_2$ 522 and $c_3$ 532 of FIG. 5 is received, respective time differencing elements $\Delta t_1$ 322, $\Delta t_2$ 324, and $\Delta t_n$ 326 (FIG. 3) accumulate an estimate of the performance of a stage associated with each respective time comparator element $\Delta t_1$ 322, $\Delta t_2$ 324, or $\Delta t_n$ 326 as compared to the respective phase signals $p_1$ 312, $p_2$ 314, and $p_n$ 316 generated for each of the completion signals $c_1$ 301, $c_2$ 303, and $c_n$ 305 to generate filtered time differences $\bar{d}_1$ 332, $\bar{d}_2$ 334, and $\bar{d}_n$ 336. The filtered time differences $\bar{d}_1$ 332, $\bar{d}_2$ 334, and $\bar{d}_n$ 336 generated by each of the time comparator elements $\Delta t_1$ 322, $\Delta t_2$ 324, $\Delta t_n$ 326, respectively, are then combined in the phase compositor 350 in the control unit 340 to produce a composite time difference signal 354 shown in FIG. 5 as the composite difference signal 550. In a particular illustrative embodiment, the composite difference signal 550 is a weighted composite. For the sake of illustration in the example of FIG. 5, exemplary weights of $w_1=1$, $w_2=2$, and $w_3=1$ have been used. The phase difference estimates were based on a single-pole infinite impulse response filter with a tap weighting of ½. This simple filter, used for illustration, computes each result as the sum of ½ of the previous result with ½ of the new time difference. This filter has a gain of 1 and an impulse response decay time constant of approximately 1.5 samples.

A digital or analog composite time difference signal 354 of FIG. 3 is generated by the phase compositor 350 is then presented to the PID controller 370. For the sake of example, the PID controller 370 is configured to pass the composite time difference signal, disabling the regulation function that would normally be driving the asynchronous processing logic 106 (FIG. 1) to its optimum low power operating point. Thus, the voltage signal 150 in this example is the same as the composite time difference signal 354 (550 in FIG. 5). As previously described, upon initial start-up, the control unit 340 may go through a start-up phase to enable computations to be performed ahead of when they are required. From that point forward, a correct filtered voltage 154 is generated to minimize power consumption while supporting timely generation of computations.

Referring to FIG. 5, at time $t_1$ 502, a data available signal 590 (e.g., presented by the data available output 111 of FIG. 1) indicates that the first data signal 501 is available. The completion signal $c_1$ 512 is subsequently generated and compared to the first phase signal $p_1$ 514 representing when the first completion signal $c_1$ 512 was expected, generating a first time difference signal $d_1$ 516 of +1.0. Filtering ½ the first time difference $d_1$ 516 yields a first filtered time difference $\bar{d}_1$ 510 of +0.5. Because the first filtered time difference $\bar{d}_1$ 510 is subject to a weight of $w_1$, the composite difference 550 is +0.5. Note that no other filtered time difference signals have yet been determined after time $t_1$ 502 and before time $t_2$ 504, thus, only the first filtered time difference $\bar{d}_1$ 510 is included in the composite difference 550. The positive value of the composite difference 550 results in an increase in the duty cycle of the modulated voltage output 560 and, in turn, a higher value of the filtered voltage 570.

At time $t_2$ 504, the data available signal 590 indicates the second data signal 503 is available to the first processing stage of the asynchronous processing logic 106. After processing of the second data signal 503, the first time difference signal $d_1$ 516 is determined to be −1.0, indicating the first completion signal $c_1$ 512 leads the first phase signal $p_1$ 514. Filtering ½ the first time difference $d_1$ 516 for the second period, including a weighting of ½ of the previous period's time filtered time difference signal $\bar{d}_1$ 510 of +1.0, yielding a filtered time difference of −0.25. At time $t_3$ 506, the data available signal 590 indicates the third data signal 505 is available to the first processing stage. After processing of the third data signal 505, the first time difference signal $d_1$ 516 is determined to be −4.0, indicating the first completion signal $c_1$ 512 significantly leads the first phase signal $p_1$ 514. Filtering ½ the first time difference $d_1$ 516 for the third period using a weighting of ½ of the previous period's filtered time difference time difference signal $\bar{d}_1$ 510 of −0.25, yields a filtered time difference $\bar{d}_1$ of −2.13. At time $t_4$ 508, the data available signal 590 indicates the fourth data signal 507 is available to the first processing stage. After processing of the fourth data signal 507, the first time difference signal $d_1$ 516 is determined to be 0, indicating the first completion signal $c_1$ 512 matches the first phase signal $p_1$ 514. Filtering ½ the first time difference $\bar{d}_1$ 510 for the fourth period including a weighting of ½ of the previous period's filtered time difference signal $\bar{d}_1$ 510 of −2.13, yields a filtered time difference $\bar{d}_1$ of −1.06.

A similar process is performed for the second completion signal $c_2$ 522 and the third completion signal $c_3$ 532. The second completion signal $c_2$ 522 is compared to the second phase signal $p_2$ 524 to determine the second time difference $d_2$ 526. The second time difference $d_2$ 526 is then filtered to generated the second filtered time difference $\bar{d}_2$ 520. The second filtered time difference $\bar{d}_2$ 520 after time $t_2$ 504 is +1.0, after time $t_3$ 506 is +1.5, and after time $t_4$ 508 is +1.75. Note that the second time difference $d_2$ 534 remains constant at +2.0 after time $t_2$ 504. Thus, the change and the reduction in the filtered time difference $\bar{d}_2$ 520 is as a function of the filtered application of the filtered time difference $\bar{d}_2$ 520 of the previous period. For the third completion signal $c_3$ 532, the third completion signal $c_3$ 532 is compared to the third phase signal $p_3$ 534 to determine the third time difference $d_3$ 536. The third time difference $d_3$ 536 is then filtered to generated the third filtered time difference $\bar{d}_3$ 530. The third filtered time difference $\bar{d}_3$ 530 after time $t_3$ 506 increases to +1.5 and after time $t_4$ 508 increases to +3.25.

The composite difference 550, in one illustrative embodiment, includes a weighted sum of the filtered time differences $\bar{d}_1$ 510, $\bar{d}_2$ 520, and $\bar{d}_3$ 530 weighted by weights $w_1$ of 1, $w_2$ of 2, and $w_3$ of 1, respectively. For example, when the first filtered time difference $\bar{d}_1$ 510 is +0.5 and the other filtered time differences $\bar{d}_2$ 520 and $\bar{d}_3$ 530 are zero at time $t_2$ 504, the filtered time difference $\bar{d}_1$ 510 of +0.5 is multiplied by the weight $w_1$ of 1 for a composite weighted difference 550 of +0.5. After time $t_2$ 504 when the second filtered time difference $\bar{d}_2$ 520 transitions to +1.0, the second filtered time difference $\bar{d}_2$ 520 is multiplied by the weight $w_2$ of 2 and added to the first filtered time difference $\bar{d}_1$ 510 for a composite weighted difference 550 of +2.5. However, after the first filtered time difference $\bar{d}_1$ 510 transitions to −0.25, the composite weighted difference 550 becomes +1.75. For further example, at time $t_4$ 508, when the first filtered time difference $\bar{d}_1$ 510 is −2.13, the second filtered time difference $\bar{d}_2$ 520 is +1.5, and the third filtered time difference $\bar{d}_3$ 530 is +1.5, the composite weighted difference 550 (CWD) is given by Eq. (1):

$$CWD=(1\times-2.13)+(2\times+1.50)+(1\times+1.5)=+2.37 \qquad (1)$$

In response to variation in the composite weighted difference 550 of FIG. 5, the voltage signal 150 (FIG. 1) or 250 (FIG. 2) is changed to change the voltage supplied to the asynchronous processing logic 106, 206. Using the example of a digital modulation-based switching converter 122 as in the system 100 of FIG. 1, the change in the voltage signal 150 results in the digital modulation-based switching converter 122 generating a modulated voltage output 560. (In the example of FIG. 5, the modulated voltage signal 560 is a duty cycle modulated signal.) The filtered voltage 570, which is the output of the modulated voltage 152 once passed through the filter 124 of the system 100 of FIG. 1, at least partially smoothes ripple in the modulated voltage output 560 to supply a ripple-reduced, filtered voltage 154 to the asynchronous processing logic 106 of FIG. 1.

Figure 6:
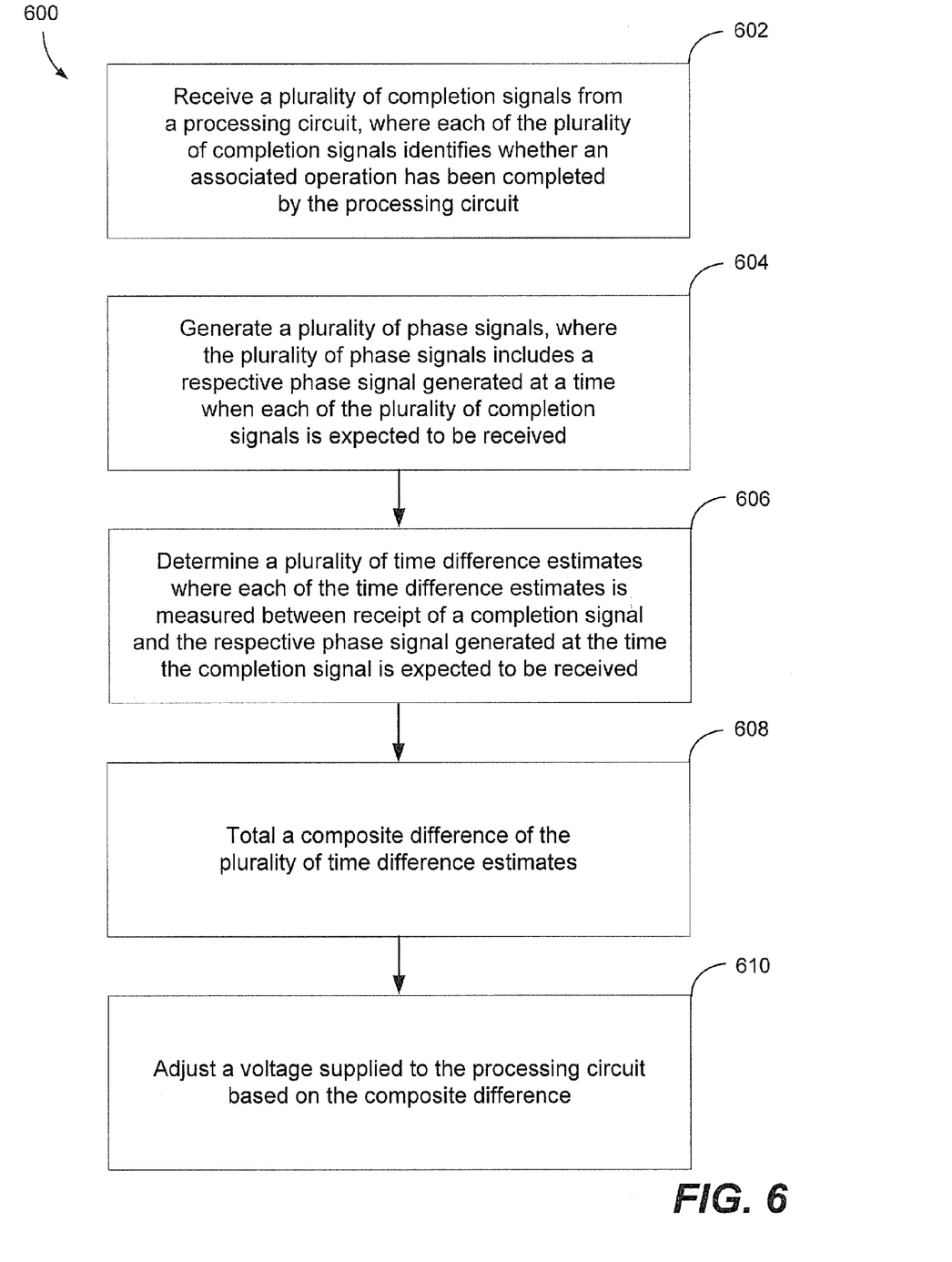
FIG. 6 is a flow diagram of a particular embodiment of a method of controlling voltage based on differences between completion signals and respective phase signals.

FIG. 6 is a flow diagram 600 of a particular embodiment of a method of controlling voltage based on differences between completion signals and respective phase signals. The method includes receiving a plurality of completion signals from a processing circuit, at 602. Each of the plurality of completion signals identifies whether an associated operation has been completed by the processing circuit. For example, the phase detector 112 (FIG. 1) may receive a plurality of completion signals 126 from the asynchronous processing logic 106 that each signify completion of a particular operation within the asynchronous processing logic 106. The method further includes generating a plurality of phase signals where each of the phase signals is generated in 604 at a time when each of the plurality of completion signals is expected to be received. For example, the phase detector 112 (FIG. 1) (such as by using the phase generator 310 of FIG. 3) may generate a plurality of phase signals 312, 314, and 316 (FIG. 3). The method further includes determining a plurality of time differences where each of the time differences is measured between receipt of a completion signal and the respective phase signal generated at the time the completion signal is expected to be received, at 606. As an example, the phase detector 112 includes time differencing elements that determine time differences as illustrated. The method further includes generating time differences and totaling a composite of the time differences, at 608. For example, the phase compositor 350 includes a summer 352 to add each of a plurality of weighted time differences to determine a composite time difference. The method further includes adjusting a voltage supplied to the processing circuit based on the composite difference, at 610. For example, the control unit 120 generates a voltage signal 150, which after modulation and filtering generates a filtered voltage 154, which supplies a voltage input 132 of the asynchronous processing logic 106.

Thus, the control unit 120 adjusts the voltage signal 150 to determine a voltage level supplied to the asynchronous processing logic 106 based on the composite difference values determined by the control unit 120 responsive to the phase detector 112. In a particular embodiment, each of the plurality of phase signals is generated at a predetermined phase offset relative to a clock signal. For example, each of the plurality of phase signals generated by the phase detector 112 is generated as a phase offset to a clock signal 128 or 114 received by the phase detector 112. Each of the plurality of the phase signals may be generated by a counter where the predetermined offset is determined by a value of the counter or the phase signals may be generated by a phase locked loop where the predetermined phase offset is determined by a feedback voltage level and a counter value within the phase-locked loop.

In another particular embodiment, the method further includes applying a numerical weight to one or more of the plurality of time differences or composite differences adjusted by the numerical weight assigned to one or more of the plurality of time differences. For example, numerical weights are applied by the phase compositor 350 within the control unit 220 as shown in FIG. 2. In a particular embodiment, the method further includes adjusting one or more of the predetermined offsets to change the composite difference resulting from the one or more of the plurality of time differences. In addition, the method may further include taking a fraction of the plurality of completion signal indications and determining the plurality of time differences between each of the fraction of the plurality of completion signal indications and the respective phase signal. For example, a plurality of the completion signals 126 is provided by the signal divider 116 of FIG. 1. Thus, the divided completion signals 136 indications from the completion signal 126 is provided to the phase detector 112 and is used by the phase detector 112 to determine the plurality of time differences.

In a particular example of a method, the voltage supplied to the asynchronous processing logic 106 (FIG. 1) is changed by changing a modulation parameter (e.g. duty cycle or frequency) of a modulated voltage that is responsive to receipt of the voltage signal 150 from the control unit 120. As an example, voltage supplied to the processing unit 106 is received from the filtered voltage 154. The filtered voltage 154 is derived by filtering the modulated voltage signal 152 to reduce ripple in the output of the digital modulation based switching converter 122. The digital modulation switching converter 122 receives the voltage signal 150 from the control unit 120; thus, the voltage signal 150 from the control unit 120 is used to control a modulation parameter of the modulated voltage signal 152 that, in turn, changes the voltage supplied to the asynchronous processing logic 106.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. For example, method steps may be performed in a different order than is shown in the figures or one or more method steps may be omitted. Accordingly, the disclosure and the figures are to be regarded as illustrative rather than restrictive.

Moreover, although specific embodiments have been illustrated and described herein, it should be appreciated that any subsequent arrangement designed to achieve the same or similar results may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, the claimed subject matter may be directed to less than all of the features of any of the disclosed embodiments.

What is claimed is:

1. A method comprising:
   receiving a plurality of completion signals from a processing circuit, wherein each of the plurality of completion signals identifies whether an associated operation has been completed by the processing circuit;
   generating a plurality of phase signals, wherein the plurality of phase signals includes a respective phase signal generated at a time when each of the plurality of completion signals is expected to be received;
   determining a plurality of time differences, wherein each of the time differences is associated with a measured time difference between receipt of a completion signal and the respective phase signal generated at the time when the completion signal is expected to be received;
   generating a composite difference of the plurality of time differences; and
   adjusting a voltage supplied to the processing circuit based on the composite difference.

2. The method of claim 1, further comprising:
   when the composite difference indicates a leading condition of the plurality of completion signals, adjusting the voltage to reduce the voltage supplied to the processing circuit; and
   when the composite difference indicates a lagging condition of the plurality of completion signals, adjusting the voltage to increase the voltage supplied to the processing circuit.

3. The method of claim 1, wherein the processing circuit includes an asynchronous self-timed logic device.

4. The method of claim 1, wherein each of the plurality of phase signals is generated at a predetermined phase offset relative to a period of a clock signal.

5. The method of claim 4, wherein each of the plurality of phase signals is generated by one of a counter, a phase-locked loop, or a combination thereof.

6. The method of claim 5, further comprising applying a numerical weight to one or more of the plurality of time differences, wherein the composite difference is adjusted by the numerical weight assigned to the one or more of the plurality of time differences.

7. The method of claim 6, further comprising adjusting a predetermined controller reference value that is compared to the composite difference resulting from the one or more of the plurality of time differences.

8. The method of claim 1, wherein the voltage supplied to the processing circuit is changed by changing a modulation parameter of a modulated voltage, wherein the modulation parameter of the modulated voltage is responsive to receipt of a voltage signal.

9. The method of claim 8, further comprising filtering the modulated voltage to reduce ripple in the modulated voltage provided to the processing circuit.

10. The method of claim 1, wherein the each of the time differences is a filtered representation associated with the measured time difference.

11. An apparatus comprising:
    a phase generator generating a plurality of phase signals, wherein each of the plurality of phase signals is generated at a phase offset to a received clock signal such that each respective phase signal of the plurality of phase signals represents a time at which one of a plurality of completion signals is expected to be received from a processing system;
    a comparator configured to determine a time difference between receipt of each of the plurality of completion signals and the respective phase signal of the plurality of phase signals; and
    a control unit configured to determine a composite time difference of each of the time differences between each of the plurality of completion signals and the respective phase signal and to generate a voltage signal to control an operational speed of the processing system, wherein:
       when the composite time difference reflects that the plurality of completion signals predominantly lag behind of the plurality of phase signals, generating the voltage signal to increase the operational speed of the processing system; and
       when the composite time difference reflects that the plurality of completion signals predominantly lead the plurality of phase signals, generating the voltage signal to decrease the operational speed of the processing system.

12. The apparatus of claim 11, wherein the phase generator includes one or more phase-locked loops, wherein the phase offset is determined by a programmed counter value comparison.

13. The apparatus of claim 11, further comprising applying a numerical weight to the time difference between receipt of the one of the plurality of completion signals and the respective phase signal.

14. The apparatus of claim 13, further comprising an adaptation interface that adjusts at least one of the phase offset of one or more of the phase signals, a controller reference value, a feedback control parameters, or a compositing parameters.

15. The apparatus of claim 11, wherein the control unit includes a proportional-integral-differential controller.

16. The apparatus of claim 11, wherein the control unit includes a feed forward controller and a feedback controller.

17. A system comprising:
    an asynchronous processing unit, wherein the asynchronous processing unit is self-timed such that each of a plurality of completion signals is generated when an operation of the asynchronous processing unit is completed;
    a clock generator configured to generate a clock signal;
    a phase detector comprising:
       a phase generator configured to generate a plurality of phase signals, wherein a respective phase signal is generated at an offset to the clock signal at a time when one of the plurality of completion signals is expected to be received; and
       a plurality of time differencing elements configured to determine a plurality of time differences, wherein each of the plurality of time differences is measured between receipt of a particular completion signal of the plurality of completion signals and the respective phase signal generated at the time when the particular completion signal is expected to be received;

a control unit configured to determine a composite difference of the plurality of time differences; and
a modulation-based voltage switching converter, wherein the modulation-based voltage switching converter modulates a voltage to be supplied to the asynchronous processing unit in response to a voltage signal generated by the control unit in response to the composite difference.

18. The system of claim 17, wherein the phase generator includes one or more phase-locked loops and wherein the offset is determined by a programmed voltage level.

19. The system of claim 17, further comprising:
a clock frequency divider configured to present a sampling of the clock signal to the phase detector; and
a completion signal divider configured to present a sampling of the plurality of completion signals to the phase detector.

20. The system of claim 17, further comprising a filter, wherein the filter receives an output of the modulation-based voltage switching converter to reduce ripple in the output of the modulation-based voltage switching converter.

* * * * *